(12) United States Patent
Su et al.

(10) Patent No.: US 11,714,132 B2
(45) Date of Patent: Aug. 1, 2023

(54) TEST EQUIPMENT DIAGNOSTICS SYSTEMS AND METHODS

(71) Applicant: Advantest Corporation, Tokyo (JP)

(72) Inventors: Mei-Mei Su, Mountain View, CA (US); Seth Craighead, San Jose, CA (US)

(73) Assignee: Advantest Corporation, Tokyo (JP)

( * ) Notice: Subject to any disclaimer, the term of this patent is extended or adjusted under 35 U.S.C. 154(b) by 72 days.

(21) Appl. No.: 17/219,297

(22) Filed: Mar. 31, 2021

(65) Prior Publication Data

US 2021/0302501 A1  Sep. 30, 2021

Related U.S. Application Data

(60) Provisional application No. 63/002,710, filed on Mar. 31, 2020.

(51) Int. Cl.
*G01R 31/319* (2006.01)
*G01R 31/28* (2006.01)

(52) U.S. Cl.
CPC ... *G01R 31/31908* (2013.01); *G01R 31/2875* (2013.01); *G01R 31/31905* (2013.01)

(58) Field of Classification Search
CPC .......... G01R 31/31908; G01R 31/2875; G01R 31/31905; G01R 31/2874; G01R 35/00; G01R 31/31917; G01R 31/31901
USPC ........................................................ 714/724
See application file for complete search history.

(56) References Cited

U.S. PATENT DOCUMENTS

| | | | |
|---|---|---|---|
| 6,574,763 B1 * | 6/2003 | Bertin ................. | G01R 31/287 324/750.05 |
| 7,415,647 B2 * | 8/2008 | Yee ................ | G01R 31/318555 714/734 |
| 7,619,427 B2 | 11/2009 | Ando et al. | |
| 8,103,927 B2 * | 1/2012 | Choi ..................... | G06F 11/263 714/741 |
| 11,327,866 B2 * | 5/2022 | Tsai .................... | G06F 11/3692 |

(Continued)

FOREIGN PATENT DOCUMENTS

JP    2009302651 A    12/2009

*Primary Examiner* — James C Kerveros

(57) ABSTRACT

Presented embodiments facilitate efficient and effective diagnostic of test system operations, including temperature control of test equipment components. In one embodiment a test equipment diagnostic method includes applying a known/expected first bit pattern to a test equipment component, applying a known/expected second bit pattern to a test equipment component, and performing a test equipment temperature control analysis based upon the results of applying the known/expected first bit pattern and known/expected second bit pattern. The first bit pattern and second bit pattern have known/expected respective thermal loads and corresponding respective first known/expected/expected temperature and second known/expected/expected temperature. In one embodiment, performing a test equipment temperature control analysis includes determining if temperature control components control a temperature of the test equipment component within acceptable tolerances. In one exemplary implementation, the test equipment component is a test control component (e.g., a field programmable gate array (FPGA), etc.).

19 Claims, 8 Drawing Sheets

(56) References Cited

U.S. PATENT DOCUMENTS

| | | | |
|---|---|---|---|
| 2003/0094939 A1* | 5/2003 | Matsuzawa | G01R 31/2849 324/762.01 |
| 2005/0243629 A1* | 11/2005 | Lee | G11C 11/40615 365/222 |
| 2008/0029244 A1* | 2/2008 | Gilliland | H01L 23/473 257/E23.098 |
| 2008/0309361 A1 | 12/2008 | Kita et al. | |
| 2013/0329356 A1* | 12/2013 | Shanbhogue | H05K 1/144 361/714 |
| 2019/0086468 A1 | 3/2019 | Yoshino et al. | |
| 2019/0150316 A1 | 5/2019 | Dayal et al. | |

* cited by examiner

310
Applying a bit pattern to a test equipment component, wherein the bit pattern has a known thermal load and corresponding known/ expected temperature.

320
Measuring a temperature of the test equipment component when the bit pattern is applied to the test equipment.

330
Performing a test equipment environmental control analysis based upon the results of applying the known bit pattern.

410
Applying a first known bit pattern to test equipment.

---

420
Applying a second known bit pattern to test equipment.

---

430
Performing a test equipment environmental control analysis based upon the results of applying the known first bit pattern and known second bit pattern.

510
Measuring a first temperature of the test equipment component when the first bit pattern is applied.

520
Measuring a second temperature of the test equipment component when the second bit pattern is applied.

530
Computing a measure temperature delta/difference based upon measured temperatures.

540
Computing a known/expected re temperature delta/difference based upon known/expected temperatures.

550
Utilizing the measured temperature delta and known/expected temperature delta in the test equipment environmental control analysis.

FIG. 5

TEST EQUIPMENT DIAGNOSTICS SYSTEMS AND METHODS

RELATED APPLICATIONS

This application claims the benefit of and priority to provisional application 63/002,710 entitled Test Equipment Diagnostics Systems and Methods filed Mar. 31, 2020, which is incorporated herein by reference.

FIELD OF THE INVENTION

The present invention relates to the field of electronic testing.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. These electronic systems and devices are typically tested to ensure proper operation. Equipment used to test the devices can also have issues that impact the operation of the test equipment and accuracy of the test results. Conventional maintenance and diagnostics are not typically capable of addressing all the issues the test equipment can suffer from.

It is typically important to maintain environmental conditions for the test equipment. Excessive heat is usually an issue or problem for conventional test equipment. Test systems often include thermal solutions and cooling components. However, previously it was difficult to evaluate effectiveness of the thermal solutions and identify defects in cooling components. Traditional approaches were not particularly efficient at measuring FPGA thermal characteristics. (e.g., typically had to inject maximum load, etc.). In addition, thermal characteristics typically cannot be determined based upon standard protocol bits.

SUMMARY

Presented embodiments facilitate efficient and effective diagnostic of test system operations, including temperature control of test equipment components. In one embodiment, a test equipment diagnostic method includes applying a known/expected first bit pattern to a test equipment component, applying a known/expected second bit pattern to a test equipment component, and performing a test equipment temperature control analysis based upon the results of applying the known/expected first bit pattern and known/expected second bit pattern. The first bit pattern has a known/expected thermal load and corresponding first known/expected temperature, and the second bit pattern has a known/expected thermal load and corresponding second known/expected temperature. In one embodiment, performing a test equipment temperature control analysis includes determining if temperature control components control a temperature of the test equipment component within acceptable tolerances. The first bit pattern can be associated with high performance test operations that generate more heat than the second bit pattern. The second bit pattern can be associated with low performance test operations that generate less heat than the first bit pattern. In one exemplary implementation, the test equipment component is a test control component. The test equipment component can be a field programmable gate array (FPGA).

In one embodiment, performing a test equipment temperature control analysis includes: measuring a first temperature of the test equipment component when the first bit pattern is applied, measuring a second temperature of the test equipment component when the second bit pattern is applied, computing a difference between the first measured temperature and the second measured temperature to determine a measured temperature delta; computing a difference between a first known/expected/expected temperature and a second known/expected/expected temperature to determine a known/expected/expected temperature delta; and utilizing the measured temperature delta and known/expected/expected temperature delta in the test equipment temperature control analysis. Performing the test equipment temperature control analysis includes can include comparing the known/expected/expected temperature delta to a measured temperature delta. In one exemplary implementation, the temperature control components are validated if comparison result of the known/expected/expected temperature delta to a measured temperature delta is within acceptable tolerances and the temperature control components are invalidated if comparison result of the known/expected/expected temperature delta to a measured temperature delta is not within acceptable tolerances.

In one embodiment, a test equipment diagnostic system includes test equipment configured to perform testing operations, and a temperature analysis system configured to validate temperature control of the test equipment, wherein the testing operations are based upon input from temperature analysis system. The test equipment can include a test controller configured to control testing operations, and a temperature measurement component configured to measure the test controller temperature. The test controller can include a field programmable gate array (FPGA). In one exemplary implementation, the temperature analysis system includes a bit pattern generator/storage component configured to forward test information to the test equipment, and a comparator configured to receive measured temperatures from the test equipment and known/expected/expected temperature values from the bit mapping component. The bit pattern mapping component is configured to track bit patterns and corresponding respective known/expected/expected temperatures. The comparator compares the measured temperatures associated with a bit pattern to respective known/expected/expected temperature values. The bit pattern mapping component can track bit pattern identifiers and respective known/expected/expected temperature values. The temperature analysis system validates temperature control of test equipment based upon a comparison of known/expected/expected temperature values and measured temperatures. In one exemplary implementation, if the measured temperature and respective known/expected/expected temperature value match within acceptable tolerances the temperature control features/operations of test the equipment validation passes, and if the measured temperature and respective known/expected/expected temperature value do not match within acceptable tolerances the temperature control features/operations of the test equipment validation fails.

In one embodiment, a test equipment diagnostic method includes applying a bit pattern to a test equipment component, measuring a temperature of the test equipment component when the bit pattern is applied to the test equipment, and performing a test equipment temperature control analysis based upon the results of applying the known/expected bit pattern. The bit pattern has a known/expected thermal load and corresponding known/expected/expected temperature. Performing a test equipment temperature control analysis can include determining if temperature control components control a temperature of the test equipment component within acceptable tolerances. Performing a test equipment temperature control analysis can include comparing the known/expected/expected temperature to a measured temperature. In one exemplary implementation, performing a test equipment temperature control analysis includes validating the temperature control components control if a temperature of the test equipment component is within acceptable tolerances, and invalidating the temperature control components control if a temperature of the test equipment component is not within acceptable tolerances.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 3 is a flow chart of a method in accordance with one embodiment.

FIG. 4 is a flow chart of a method in accordance with one embodiment. In one embodiment, the method is a test equipment diagnostic method.

FIG. 5 is a flow chart of a delta temperature determination process in accordance with one embodiment.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Presented embodiments are directed to test equipment diagnostic systems and methods that facilitate efficient and effective temperature diagnostics and validating temperature control operations. In one embodiment, a temperature diagnostic for test equipment is performed to validate a temperature control system performance. The test equipment can be a field programmable gate array (FPGA). The temperature diagnostics can be referred to as over-temperature diagnostics. In one embodiment, a known bit pattern is applied to the test equipment in order to validate the associated temperature control system by measuring the temperature of the test equipment after application of the bit pattern. A diagnostics bitmap file can be applied to the FPGA to give it a known/expected thermal load. Based on the known thermal load of the FPGA (e.g., resultant from the bitmap file applied, etc.), the temperature control efficiency/acceptance of the thermal temperature control system can be validated by measuring the temperature of the FPGA.

Figure 1:
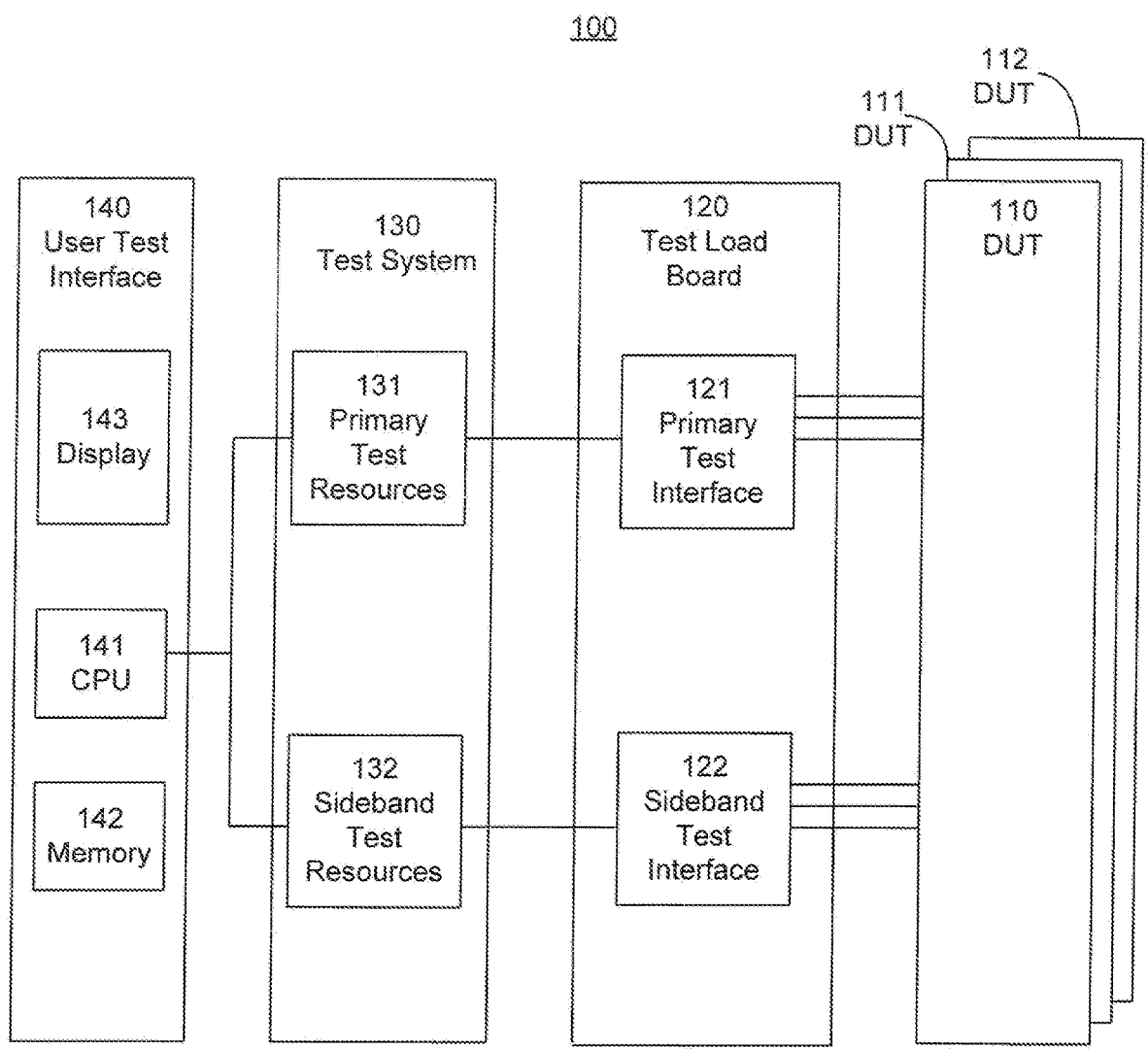
FIG. 1 is a block diagram of an exemplary test environment or system in accordance with one embodiment.

FIG. 1 is a block diagram of an exemplary test environment or system 100 in accordance with one embodiment. The test environment or system 100 includes devices under test (DUT) (e.g., 110, 111, 112, etc.), test or load board 120, test equipment 130, and user test interface 140. The DUTs (e.g., 110, 111, 112, etc.) are coupled to the test load board 120 which is coupled to test equipment 130, which in turn is coupled to the CPU 141. In one embodiment, the test load board 120 includes primary or persistent test interface 121 and sideband interface 122, Load board 120 is configured to electrically and physically couple the DUTs to the test equipment 130. Test equipment 130 direct and controls testing of the DUTs and includes resources that are assigned to the respective DUTs. In one exemplary implementation, resources are assigned to DUT 110 as primary test resources 131 and sideband resources 132. Test equipment 130 can include a Field Programmable Gate Array (FPGA). In one embodiment, test various information (e.g., test results, preliminary analysis results, reconfigured test information, testing directions, etc.) is communicated between test equipment 130 and user test interface 140. User test interface 140 includes processing unit 141, memory 142, and display 143. Memory 142 can store testing related information, processing unit 141 can process the information, and display 143 can display the information.

In one embodiment, test equipment diagnostic systems and methods pertain to a process of using a diagnostics bit file to assert a known/expected thermal load on the test equipment to properly determine the temperature control efficiency of the temperature control system by measuring the resultant temperature of test equipment. In one exemplary implementation, the test equipment diagnostic systems and methods assert a delta thermal load to a component of the test equipment (e.g., a controller, a FPGA, etc.) and measure the test equipment component temperature to validate temperature control efficiency. Using this process, the test equipment diagnostic systems and methods can advantageously detect errors in the temperature control system used in the tester.

In one embodiment, the diagnostics bitmap or bit pattern is a known pattern and delivers a known/expected power load to the test equipment component (e.g., a controller, a FPGA, etc.). The test equipment diagnostic systems and methods measure two temperatures at two known/expected power draw points of the test equipment component. In one exemplary implementation, the invention records temperatures at a low power setting and at a high-power setting to get a delta temperature reading. The test equipment diagnostic systems and methods know the expected power consumption at those two points as well, and based on those measurements, the test equipment diagnostic systems and methods can validate the temperature control system thereby.

Figure 2:
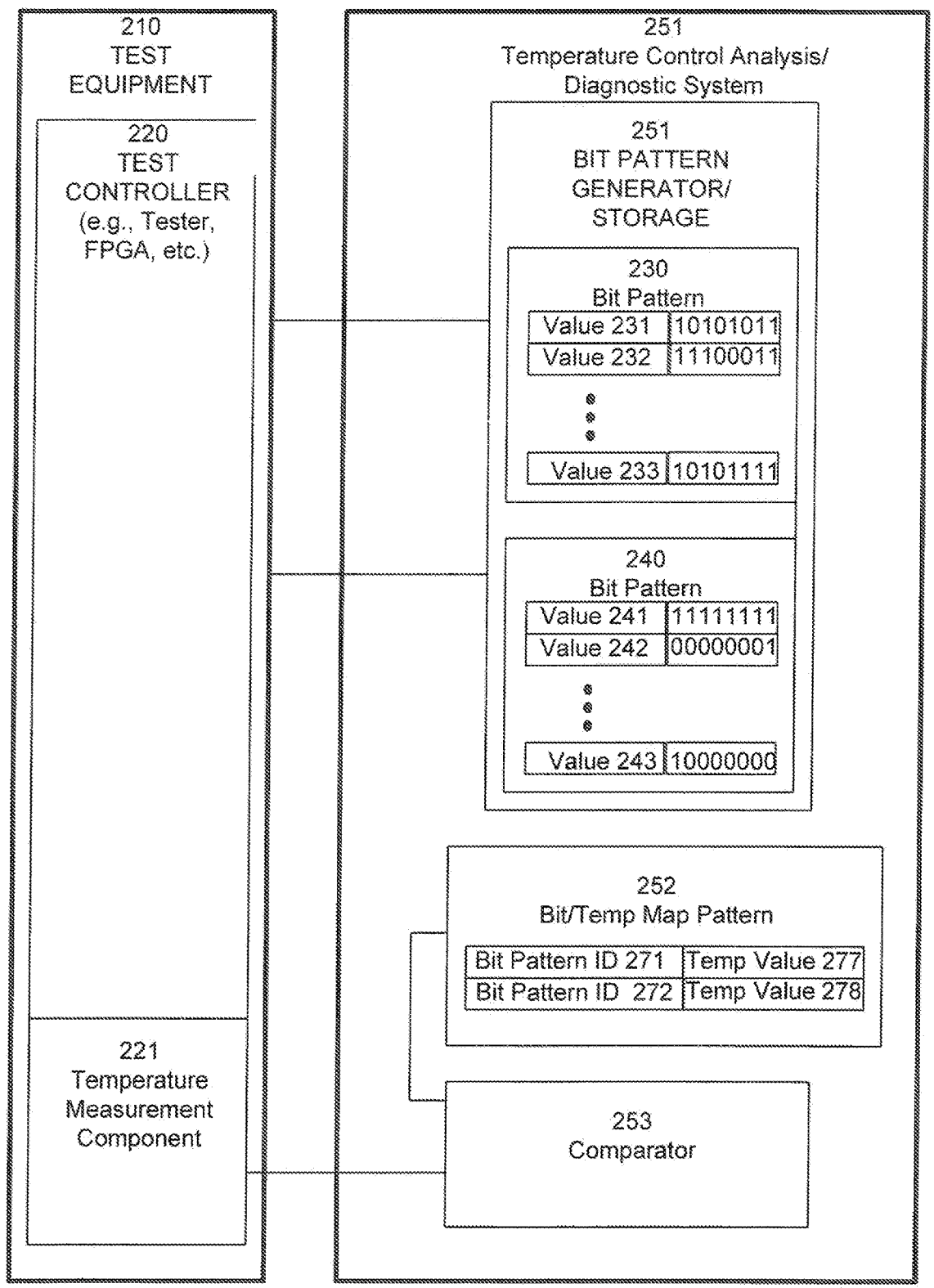
FIG. 2 is a block diagram of exemplary test equipment diagnostic system in accordance with one embodiment.

FIG. 2 is a block diagram of exemplary test equipment diagnostic system 200 in accordance with one embodiment. Test equipment diagnostic system 200 includes test equipment 210 and temperature analysis system 250. In one embodiment, temperature analysis system 250 is included in test equipment 210. In one embodiment, temperature analysis system 250 is a separate/distinct system that is selectively/removably coupled to test equipment 210. Test equipment 210 includes test controller 220 and temperature measurement component 221. Temperature analysis system 250 includes bit pattern generator/storage component 251, bit pattern mapping component 252, comparator 253.

The components of test equipment diagnostic system 200 cooperatively operate to provide performance temperature diagnostics of test equipment 210 components. In one exemplary implementation, test equipment diagnostic system 200 cooperatively operate to provide performance temperature diagnostics of test controller 220. Test equipment 210 is configured to perform testing operations based upon input from temperature analysis system 251. Test controller 220 is configured to control/direct the test operations of test equipment 210. Temperature analysis system 250 validates temperature control of test equipment 210. Bit pattern generator/storage component 251 is configured to forward test information (e.g., test pattern information, test instructions, etc.) to test equipment 210. In one embodiment, bit pattern generator/storage component 251 is similar to an automatic test pattern generator ATPG. In one embodiment, the test patterns are generated by another component (not shown) and provided to bit pattern generator/storage component 251. In one exemplary implementation, bit pattern generation/storage system 251 generates/stores multiple bit patterns including bit pattern 230 and bit pattern 240. Bit pattern 230 can be associated with a high heat generating operation (e.g., high power consumption, complicated test operation, strenuous performance operation, etc.) and bit pattern 240 can be associated with a low heat generating operation (e.g., low power consumption, simple test operation, easy performance operation, etc.). Bit pattern mapping component 252 is configured to track bit patterns and corresponding respective known/expected temperatures. In one embodiment, bit pattern mapping component 252 tracks bit pattern identifiers 271 and 272 (e.g., for bit pattern 230, etc.) and respective known/expected temperature values 277 and 278. Temperature analysis system 250 validates temperature control of test equipment 210 based upon a comparison of known/expected temperature values and measure temperatures.

Comparator 253 receives measured temperatures from test equipment 210 in response to simulating/performing test operations associated with bit patterns from bit pattern generator storage 251. Comparator 253 also receives known/expected temperature values from temperature mapping component 252. Comparator 253 compares the measured temperatures associated with a bit pattern to respective known/expected temperature values. If the measured temperatures and respective known/expected temperature values match within acceptable tolerances the temperature control features/operations of test equipment 210 validation passes. If the measured temperatures and respective known/expected temperature values do not match within acceptable tolerances the temperature control features/operations of test equipment 210 validation fails.

FIG. 3 is a flow chart of a method 300 in accordance with one embodiment.

In block 310, a bit pattern is applied to a test equipment component, wherein the bit pattern has a known/expected thermal load and corresponding known/expected temperature.

In block 320, a temperature of the test equipment component is measured when the bit pattern is applied to the test equipment.

In block 330, a test equipment environmental control analysis is performed based upon the results of applying the known bit pattern. In one embodiment, performing a test equipment environmental control analysis includes determining if environmental control components control a temperature of the test equipment component within acceptable tolerances. Performing a test equipment environmental control analysis can include comparing the known/expected temperature to a measured temperature. In one exemplary implementation, the environmental control components effectiveness/control is validated if a temperature of the test equipment component is within acceptable tolerances; and the environmental control components effectiveness/control is not validated if a temperature of the test equipment component is not within acceptable tolerances.

FIG. 4 is a flow chart of a method 400 in accordance with one embodiment. In one embodiment, method 400 is a test equipment diagnostic method. In one exemplary implementation the test equipment diagnostic method 400 is a process configured to determine validation of temperature control of a test equipment component. The test equipment component can be a test control component. The test equipment component can be a field programmable gate array (FPGA).

In block 410 a known first bit pattern is applied to a test equipment component. The first bit pattern has a known/expected thermal load and corresponding first known/expected temperature. In one exemplary implementation, the first bit pattern is associated with high performance test operations. The high-performance test operations can generate more heat than the second bit pattern.

In block 420, a known second bit pattern is applied to a test equipment component. The second bit pattern has a known/expected thermal load and corresponding second known/expected temperature. In one exemplary implementation, the second bit pattern is associated with low performance test operations. The low performance test operations can generate more heat than the second bit pattern.

In block 430. a test equipment environmental control analysis is performed based upon the results of applying the known first bit pattern and known second bit pattern. In one embodiment, performing a test equipment environmental control analysis includes determining if environmental control components control a temperature of the test equipment component within acceptable tolerances. In one embodiment a test equipment environmental control analysis includes a delta temperature determination process. Performing the test equipment environmental control analysis can include comparing the known/expected temperature delta to a measured temperature delta. In one exemplary implementation, the environmental control components control is validated if comparison result of the known/expected temperature delta to a measured temperature delta is within acceptable tolerances, and the environmental control components control are validated if comparison result of the known/expected temperature delta to a measured temperature delta is within acceptable tolerances.

FIG. 5 is a flow chart of a delta temperature determination process 500 in accordance with one embodiment.

In block 510, a first temperature of the test equipment component is measured when the first bit pattern is applied.

In block 520, a second temperature of the test equipment component is measured when the second bit pattern is applied.

In block 530, a difference between the first measured temperature and the second measured temperature is computed to determine a measured temperature delta.

In block 540, a difference between a first known/expected temperature and a second known/expected temperature is computed to determine a known/expected temperature delta.

In block 550, the measured temperature delta and known/expected temperature delta are utilized in the test equipment environmental control analysis.

Figure 6:
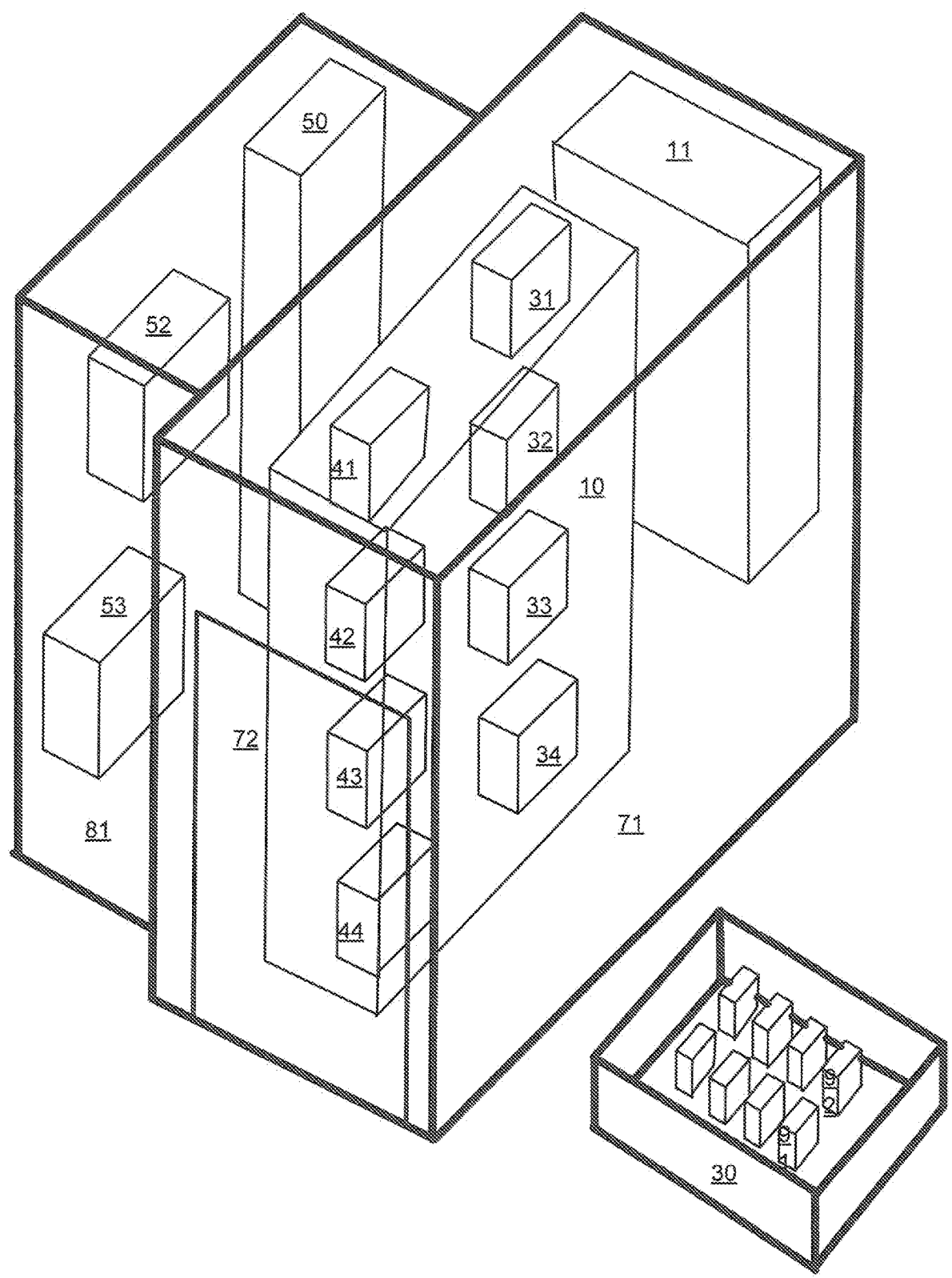
FIG. 6 is a block diagram of an exemplary testing system in accordance with one embodiment.
Figure 7:
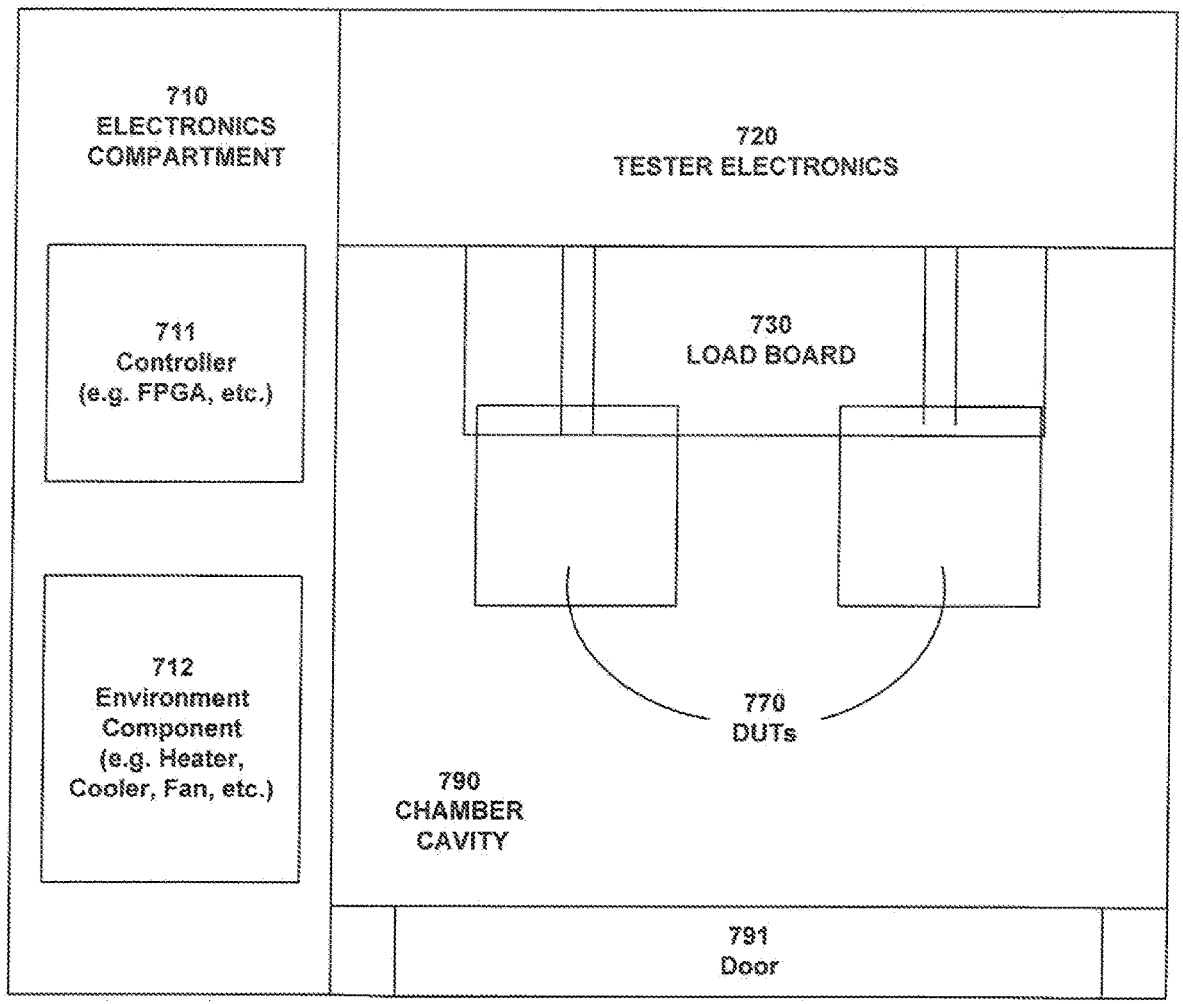
FIG. 7 is a block diagram of an exemplary testing system in accordance with one embodiment.
Figure 8:
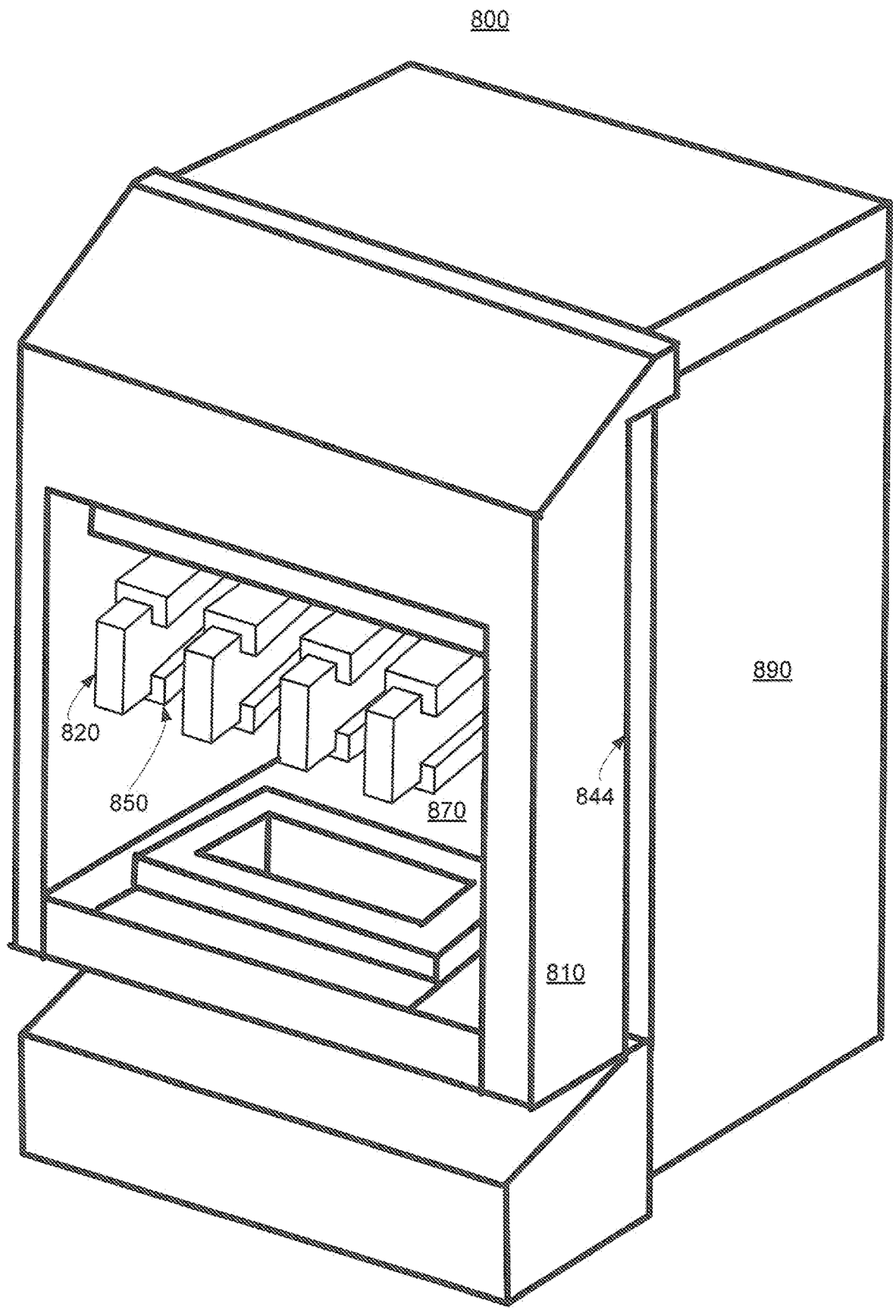
FIG. 8 is a block diagram of an exemplary test system in accordance with one embodiment.

In one embodiment, temperature diagnostic systems and methods can be implemented in test systems similar to the embodiments shown in the FIGS. 6, 7, and 8.

It is appreciated that selectable testing systems and methods can be implemented in various testing system configurations or approaches. FIG. 6 is a block diagram of an exemplary testing system in accordance with one embodiment. It consists of a large controlled environmental chamber or oven 71 that contains an oven rack 10 and heating and cooling elements 11. The oven rack 10 contains devices under test (DUTs) in a number of load board trays 31, 32, 33, 34, 41, 42, 43, and 44. The environmental test chamber 71 has solid walls and a solid door 72 that enclose the test rack 10. The heating and cooling elements 11 can have a wide temperature range (e.g., −10 to 120 degrees C.). The tester or test head 81 contains various racked components, including system controller network switches 52, system power supply components 53, and tester slices 50 (the tester slice contains the tester electronics). The load board trays (e.g., 30, 31, etc.) are connected to tester slices 50 (multiple load board trays can be coupled to a single tester slice). There is also a block diagram of a tester tray 30 and devices under test (e.g., 91, 92, etc.). The load board trays are manually populated with devices under test. The full tester trays (e.g., 30, 31, etc.) are manually inserted into environmental chamber 71 and manually connected to the tester electronics (e.g., 50, 52, 53, etc.). This process can be labor intensive and cumbersome (e.g., the process requires opening the door 72 of the environmental chamber 71 and manually trying to insert the trays though the door 72 into the appropriate location).

FIG. 7 is a block diagram of an exemplary testing system 700 in accordance with one embodiment. Testing system 700 includes electronics compartment 710 and tester electronics 720, load board 730, DUTs 770, and testing chamber 790 with door 791. Electronics compartment 710 includes controller 711 and environment compartment 712. In one embodiment, test equipment diagnostic systems and methods can be implemented in a test system similar to the one shown in the FIG. 7. In one exemplary implementation, the test equipment diagnostic systems and methods determines if the environment components 712 (e.g., cooler, fan, etc.) are providing appropriate cooling to other test equipment components (e.g., controller 711, FPGA, etc.).

In one embodiment, a test system includes device interface board and tester electronics that control testing operations. The tester electronics can be located in an enclosure which together are referred to as the primitive. The device interface board has a device under test access interface that allows physical manipulation of the devices under test (e.g., manual manipulation, robotic manipulation, etc.). A device under test can be independently manipulated physically with little or no interference or impacts on testing operations of another device under test. Device interface boards and their load boards can be conveniently setup to accommodate different device form factors. In one embodiment, load boards are configured with device under test interfaces and universal primitive interfaces. In one exemplary implementation, the device interface board can control an ambient environment of a device under test.

FIG. 8 is a block diagram of an exemplary test system 800 in accordance with one embodiment. Test system 800 includes a testing primitive 890 (e.g., containing the testing control hardware and power supply components for the devices under test, etc.) and a device interface board (DIB) 810 disposed in front of and coupled to the primitive 890. In one embodiment, the device interface board 810 is a partial enclosure. The load board is also coupled to and electrically interfaces with the primitive 890 to obtain power and high-speed electrical signals for testing the device under test 820. The device interface board can include air flow channels 844 that allow air flow to and from the device under test environment. The air flow channels 844 can include baffles. The device interface board 810 partial enclosure includes a device under test access interface 870 that enables easy physical access (e.g., unobstructed, unimpeded, etc.) to the devices under test. Environmental control components 811 and 814 control and maintain device under test ambient environmental conditions (e.g., temperature, air flow rate, etc.). The environmental control components can create an environmental envelope that prevents or mitigate interference from outside environmental conditions on the operations of devices under test. While access to test system 800 may be easier than test system 700, test system configuration adapters enable both supplemental operations and functional testing that still offers benefits associated with not requiring the expensive and time-consuming multiple moves of DUTs between separate test systems (unlike conventional test approaches).

Thus, test equipment diagnostic systems and methods can enable efficient and effective gathering of information for FPGA temperature diagnostics. This approach enables known bit patterns to provide an indication of FPGA thermal characteristics and power draw problems. In one embodiment, the known bit pattern approach provides temperature diagnostics indications that are not available as a practical matter with prior art normal operation/standard protocol bits. In one exemplary implementation, test equipment diagnostic systems and methods can evaluate effectiveness/acceptability of the thermal solutions and identify defects in thermal control components.

While the invention has been described in conjunction with the preferred embodiments, it will be understood that they are not intended to limit the invention to these embodiments. On the contrary, the invention is intended to cover alternatives, modifications, and equivalents. The description is not intended to be exhaustive or to limit the invention to the precise forms disclosed, and obviously many modifications and variations are possible.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium, it is not intended to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the description includes exemplary concepts or embodiments associated with the novel approach. It is also appreciated that the listing is not exhaustive and does not necessarily include all possible implementation. The concepts and embodiments can be implemented in hardware, firmware, software, and so on. In one embodiment, the methods or process describe operations performed by various processing components or units. In one exemplary implementation, instructions, or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A test equipment diagnostic method comprising:
    applying a known first bit pattern to a test equipment component, wherein the first bit pattern has a known thermal load and corresponding first known temperature;
    applying a known second bit pattern to a test equipment component, wherein the first bit pattern and second bit pattern are different the second bit pattern has a known thermal load and corresponding second known temperature; and
    performing a test equipment temperature control analysis based upon the results of applying the known first bit pattern and known second bit pattern, wherein performing the test equipment temperature control analysis includes determining if temperature control components control a temperature of the test equipment, including comparing a known temperature delta to a measured temperature delta.

2. The test equipment diagnostic method of claim 1 wherein performing the test equipment temperature control analysis includes determining if the temperature control components control the temperature of the test equipment component within acceptable tolerances.

3. The test equipment diagnostic method of claim 1 wherein the performing a test equipment temperature control analysis includes:
    measuring a first temperature of the test equipment component when the first bit pattern is applied;
    measuring a second temperature of the test equipment component when the second bit pattern is applied;
    computing a difference between the first measured temperature and the second measured temperature to determine the measured temperature delta;
    computing a difference between the first known temperature and the second known temperature to determine the known temperature delta; and
    utilizing the measured temperature delta and the known temperature delta in the test equipment temperature control analysis.

4. The test equipment diagnostic method of claim 1 wherein the performing a test equipment temperature control analysis includes validating the temperature control components if comparison result of the known temperature delta to the measured temperature delta is within acceptable tolerances.

5. The test equipment diagnostic method of claim 4 wherein the performing a test equipment temperature control analysis includes invalidating the temperature control components if comparison result of the known temperature delta to the measured temperature delta is not within acceptable tolerances.

6. The test equipment diagnostic method of claim 1 wherein the first bit pattern is associated with high performance test operations that generate more heat than the second bit pattern.

7. The test equipment diagnostic method of claim 1 wherein the second bit pattern is associated with low performance test operations that generate less heat than the first bit pattern.

8. The test equipment diagnostic method of claim 1 wherein the test equipment component is a test control component.

9. The test equipment diagnostic method of claim 1 wherein the test equipment component is a field programmable gate array (FPGA).

10. A test equipment diagnostic system comprising:
    test equipment configured to perform testing operations; and
    a temperature analysis system configured to validate temperature control of the test equipment, wherein the testing operations are based upon input from the temperature analysis system, wherein the temperature analysis system includes
a bit pattern mapping component configured to track bit patterns and corresponding respective known temperature values; and
a comparator configured to receive measured temperature values from the test equipment and the respective known temperature values from the bit mapping component, wherein the measured temperature values correspond to the bit patterns and the comparator compares the measured temperature values to the respective known temperature values.

11. The test equipment diagnostic system of claim 10, wherein the test equipment includes:
a test controller configured to control testing operations; and
temperature measurement component configured to measure the test controller temperature.

12. The test equipment diagnostic system of claim 11, wherein the test controller is a field programmable gate array (FPGA).

13. The test equipment diagnostic system of claim 10, wherein temperature analysis system includes
a bit pattern component configured to forward test information to the test equipment.

14. The test equipment diagnostic system of claim 10, wherein the bit pattern mapping component tracks bit pattern identifiers and the respective known temperature values.

15. The test equipment diagnostic system of claim 10, wherein the temperature analysis system validates temperature control features and operations of the test equipment based upon a comparison of the respective known temperature values and the measured temperature values, wherein:
if the measured temperature values and the respective known temperature values match within acceptable tolerances the temperature control features and operations of test equipment passes validation; and
if the measured temperature values and the respective known temperature value do not match within acceptable tolerances of the temperature control features and operations of the test equipment fails validation.

16. A test equipment diagnostic method comprising:
applying a bit pattern to a test equipment component, wherein the bit pattern has an expected thermal load and corresponding expected temperature;
measuring a temperature of the test equipment component when the bit pattern is applied to the test equipment; and
performing a test equipment temperature control analysis based upon the results of applying the bit pattern.

17. The test equipment diagnostic method of claim 16 wherein performing a test equipment temperature control analysis includes determining if temperature control components control a temperature of the test equipment component within acceptable tolerances.

18. The test equipment diagnostic method of claim 16 wherein performing a test equipment temperature control analysis includes comparing the expected temperature to a measured temperature.

19. The test equipment diagnostic method of claim 16 wherein the performing a test equipment temperature control analysis includes:
validating temperature control if the temperature of the test equipment component that is measured is within acceptable tolerances; and
invalidating the temperature control if the temperature of the test equipment component that is measured is not within acceptable tolerances.

* * * * *